(12) United States Patent
Lee et al.

(10) Patent No.: US 6,404,277 B1
(45) Date of Patent: Jun. 11, 2002

(54) GM-C TUNING CIRCUIT WITH FILTER CONFIGURATION

(75) Inventors: Kyeongho Lee; Deog-Kyoon Jeong, both of Seoul (KR)

(73) Assignee: GCT Semiconductor, Inc., San Jose, CA (US)

( * ) Notice: Subject to any disclaimer, the term of this patent is extended or adjusted under 35 U.S.C. 154(b) by 0 days.

(21) Appl. No.: 09/709,310

(22) Filed: Nov. 13, 2000

Related U.S. Application Data

(63) Continuation of application No. 09/121,863, filed on Jul. 24, 1998, now Pat. No. 6,194,947, and a continuation-in-part of application No. 09/121,601, filed on Jul. 24, 1998.
(60) Provisional application No. 60/164,874, filed on Nov. 12, 1999.

(51) Int. Cl.[7] ................................................ H03K 5/01
(52) U.S. Cl. ...................................... 327/553; 327/552
(58) Field of Search ............................... 327/552, 553, 327/558, 559, 156; 330/305

(56) References Cited

U.S. PATENT DOCUMENTS

| | | | |
|---|---|---|---|
| 5,175,729 A | 12/1992 | Borras et al. ................ 370/345 |
| 5,408,201 A | 4/1995 | Uriya ............................. 331/2 |
| 5,418,815 A | 5/1995 | Ishikawa et al. ............. 375/216 |
| 5,438,591 A | 8/1995 | Oie et al. ..................... 375/261 |
| 5,448,772 A | 9/1995 | Grandfield ................... 327/357 |
| 5,471,168 A | * 11/1995 | Sevenhans et al. .......... 327/553 |
| 5,507,025 A | 4/1996 | Rodeffer ...................... 455/266 |
| 5,555,182 A | 9/1996 | Galm ............................ 702/69 |
| 5,584,062 A | 12/1996 | Meador et al. .............. 455/260 |
| 5,614,868 A | 3/1997 | Nielson ....................... 331/1 A |
| 5,635,863 A | * 6/1997 | Price, Jr. ....................... 327/3 |
| 5,734,970 A | 3/1998 | Saito ............................ 455/76 |
| 5,761,617 A | 6/1998 | Yonekura et al. ........... 455/343 |
| 5,794,119 A | 8/1998 | Evans et al. .................. 455/71 |
| 5,861,773 A | 1/1999 | Meyer ......................... 329/304 |
| 5,872,810 A | 2/1999 | Phillips et al. .............. 375/222 |
| 5,880,613 A | 3/1999 | Ishihara ....................... 327/202 |
| 5,894,592 A | 4/1999 | Brueske et al. ............... 455/86 |
| 5,950,119 A | 9/1999 | McGeehan et al. .......... 455/302 |
| 5,963,855 A | 10/1999 | Lussenhop et al. ....... 455/226.2 |
| 6,084,905 A | 7/2000 | Ishifuji et al. .............. 375/202 |
| 6,097,768 A | 8/2000 | Janesch et al. ............. 375/330 |

\* cited by examiner

Primary Examiner—Dinh T. Le
(74) Attorney, Agent, or Firm—Fleshner & Kim, LLP

(57) ABSTRACT

A tuning circuit for an RF communications system and method includes a master block that outputs a control signal to a slave block. The master block can include a first filter having a high pass filter and a low pass filter that each receive the control signal, a first rectifier coupled to the high pass filter, a second rectifier coupled to the low pass filter, and a converter coupled to the first and second rectifiers that outputs the control signal. The first filter is preferably a gm-C poly-phase filter. Output signals of the gm-C poly-phase filter include high and low pass filtering signals resulting from similarly configured circuits so that the output signals have the same electrical characteristics, which results in an increased accuracy, for example, in a cut-off frequency.

20 Claims, 8 Drawing Sheets

GM-C TUNING CIRCUIT WITH FILTER CONFIGURATION

This application is a continuation-in-part of application Ser. No. 09/121,863 filed Jul. 24, 1998 now U.S. Pat. No. 6,194,947 and Ser. No. 09/121,601 filed Jul. 24, 1998, and claims priority to Provisional Application No. 60/164,874 filed Nov. 12, 1999, the contents of which are incorporated by reference.

BACKGROUND OF THE INVENTION

1. Field of the Invention

The present invention relates to a gm-C tuning circuit and method for using same, and in particular to a gm-C tuning circuit using a poly-phase filter.

2. Background of the Related Art

Generally, a post-fabrication transconductance of an operational transconductance amplifier (OTA) should be adjusted according to the process-variations of components to maintain a selected precise cut-off frequency. A gm-C tuning scheme generally uses a master-slave tuning scheme to adjust a filter frequency that is inversely proportional to gm/C time constant (or RC time constant). In the master-slave tuning scheme, a master circuit is a copy of a slave block. The master circuit receives absolute frequency information from an external oscillator and adjusts transconductance to get the selected filter cut-off frequency. The control voltage of a master tuning feedback loop in the master circuit is copied to the slave block to reproduce the adjusted transconductance on the slave block. Then, the slave block becomes a main filter body whose cut-off frequency is controlled by the master circuit. Three related art master-slave tuning circuits will now be described.

FIG. 1 is a diagram that illustrates a master-slave voltage controlled oscillator (VCO) based tuning scheme. As shown in FIG. 1, a master block 110 outputs a control voltage 130 to a slave filter 140. As shown in FIG. 1, the master circuit 110 includes a comparator 111, a low pass filter 112, a rectifier 113, a voltage-to-current (V-I) converter 115, a low pass filter 116 that outputs a feedback signal 118 and a master VCO 120. The slave filter 130 is a copy of a master circuit.

In the master circuit 110, a comparator 111 compares a reference frequency Fref with an output frequency of the master VCO 120 $f_m$. The low pass filter 112 low pass filters an output of the comparator to provide the control voltage 130 of the master circuit 110 that is copied to the slave filter 130. The rectifier 113 rectifies the output frequency $f_m$ from the master VCO 120, and the V-I converter 115 converts an input voltage from the rectifier 113 and a reference voltage Vref. The low pass filter 116 receives a converted current from the V-I converter 115 and outputs the feedback signal 118 to the master VCO 120. In FIG. 1, an oscillation frequency of the master VCO 120 is determined by a time constant of each integrator, that is, the C/gm time constant when the gm-C integrator is used for the master VCO 120. The gm-C VCO based tuning circuit has relatively small hardware requirements and a simple feedback structure. However, the related art gm-C VCO tuning circuit has the disadvantage that a very high Q-factor is required for the VCO oscillation.

FIG. 2 is a diagram that illustrates another related art master-slave voltage controlled filter tuning scheme. As shown in FIG. 2, a master block 210 includes a comparator 211, a low pass filter 212, first and second rectifiers 213, 214, a voltage to current (V-I) converter 215, a low pass filter 216 and a master biquad 220. The master block 210 copies a control voltage 230 to a slave filter 240. The master circuit 210 is a copy of a slave filter 240.

As shown in FIG. 2, the comparator 211 of the master block 210 receives a reference voltage Fref frequency and an output frequency $f_m$ from the master biquad. The low pass filter 212 receives an output from the comparator 211 and outputs the control voltage 230 to the slave filter 240 and the master biquad 220. The first rectifier 213 receives the output frequency $f_m$ from the master biquad 220, and the second rectifier 214 receives the reference frequency Fref. The V-I converter 215 receives an output from the first rectifier 213 and the second rectifier 214, respectively. The low pass filter 216 receives an output from the V-I converter 215 and provides a second feedback signal to the master biquad 220. In the related art master-slave voltage controlled filter tuning circuit shown in FIG. 2, the quality factor of the filter is used for the feedback loop control signal 218. However, to provide sufficient sensitivity for phase tuning, the quality factor of the master circuit 210 must be large enough to provide sufficient sensitivity to phase tuning. The large quality factor of the master circuit 210 results in poor matching between the master block 210 and the slave block 240, which determines accuracy of the master-slave tuning system. The quality factor, Q, of the filter is used for the feedback loop control signal 218 is shown at equations 1A, 1B, 2A and 2B as follows:

$$H(s)LPF = \frac{\varpi_0^2}{s^2 + (\varpi_0/Q)s + \varpi_0^2} \quad (1A)$$

$$H(s)BPF = \frac{\varpi_0 s}{s^2 + (\varpi_0/Q)s + \varpi_0^2} \quad (1B)$$

wherein $H_{LPF}$ of Equation 1A and $H_{BPF}$ of Equation 1B are the Laplace transforms of the low pass filter and the band pass filter, respectively, of FIG. 2. Substituting the jω for the Laplace variable s yields.

$$H(j\varpi_0)LPF = \frac{\varpi_0^2}{-\varpi_0^2 + (\varpi_0/Q)j\varpi_0 + \varpi_0^2} = -jQ \quad (2A)$$

$$H(j\varpi_0)BPF = \frac{j\varpi_0^2}{-\varpi_0^2 + (\varpi_0/Q)j\varpi_0 + \varpi_0^2} = Q \quad (2B)$$

FIG. 3 is a diagram that illustrates a related master-slave single integrator tuning scheme. As shown in FIG. 3, a master block 310 copies control voltage 330 to a slave filter 340. The master block 310 is a copy of the slave filter 330. As shown in FIG. 3, the master block 310 includes a first rectifier 313, a second rectifier 314, a voltage to current (V-I) converter 315, a low pass filter 316 and a single integrator 320. As shown in FIG. 3, the first rectifier 313 receives an output frequency $f_m$ from the single integrator 320, and the second rectifier 314 receives a reference frequency Fref. The V-I converter 315 receives output signals from the first rectifier 313 and the second rectifier 314. The low pass filter 316 receives output from the V-I converter 315 to output the control voltage 330 to the slave filter 340 and as a feedback signal 318 to the single integrator 320.

As shown in FIG. 3, the related art master-slave single integrator tuning scheme uses gm-C integrator 320 as the master of tuning to overcome various problems associated with the VCO type tuning scheme and the VCF type tuning scheme described above. In the single integrator tuning scheme shown in FIG. 3, the gm-C integrator 320 operates as a capacitor equivalent. The amplitude of the gm-C integrator 320 output and that of the input Fref are compared using the rectifier 313, 314 and the V-I converter 315. However, the input of the gm-C integrator 320 comes from an external oscillator and an output comes from an Operational Transconductance Amplifier (OTA) cell, which causes inaccurate tuning results.

In all of the above-discussed related art approaches, either a high Q factor results in poor matching between the master and the slave, or the input of gm-C integrator comes from an external oscillator and the output comes from the OTA cell which produces inaccurate timing results.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

Another object of the present invention is to provide a master-slave circuit not limited by frequency or Q-factor requirements.

Another object of the present invention is to provide a master-slave tuning circuit using a poly-phase filter.

Another object of the present invention is to provide a master-slave gm-C poly-phase filter having the same electrical characteristics for a first filter and a second filter compared in the master-slave filters.

Another object of the present invention is to provide a gm-C poly-phase filter having output signals from high and low pass filters provided by the same circuit.

Another object of the present invention is to provide a master-slave tuning circuit having increased accuracy.

Another object of the present invention is to provide a more robust master-slave tuning circuit with increased accuracy and a simplified configuration.

To achieve the above described objects in a whole or in parts and in accordance with the present invention, there is provided a tuning circuit that includes a slave filter block and a master filter block that outputs a control signal to the slave filter block, wherein the master filter block that includes a first filter including a high pass filter and a low pass filter, wherein each of the high and low pass filters receives the control signal, a first rectifier coupled to the high pass filter, a second rectifier coupled to the low pass filter and a converter coupled to the first and second rectifiers that outputs the control signal.

To further achieve the above described objects in a whole or in parts and in accordance with the present invention, there is provided a receiver for an RF communications system that includes an RF section coupled to receive an input RF signal, a baseband section coupled to the RF section to receive corresponding baseband signals from the RF section, a phase lock loop coupled to the RF section and a tuning circuit that outputs a control signal to the baseband section, wherein the tuning circuit includes a master block and a slave block each including a first filter including a high pass filter and a low pass filter, wherein each of the high and low pass filter receives the control signal, a first rectifier coupled to the high pass filter, a second rectifier coupled to the low pass filter, and a converter coupled to the first and second rectifiers that outputs a control voltage to the high and low pass filters.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
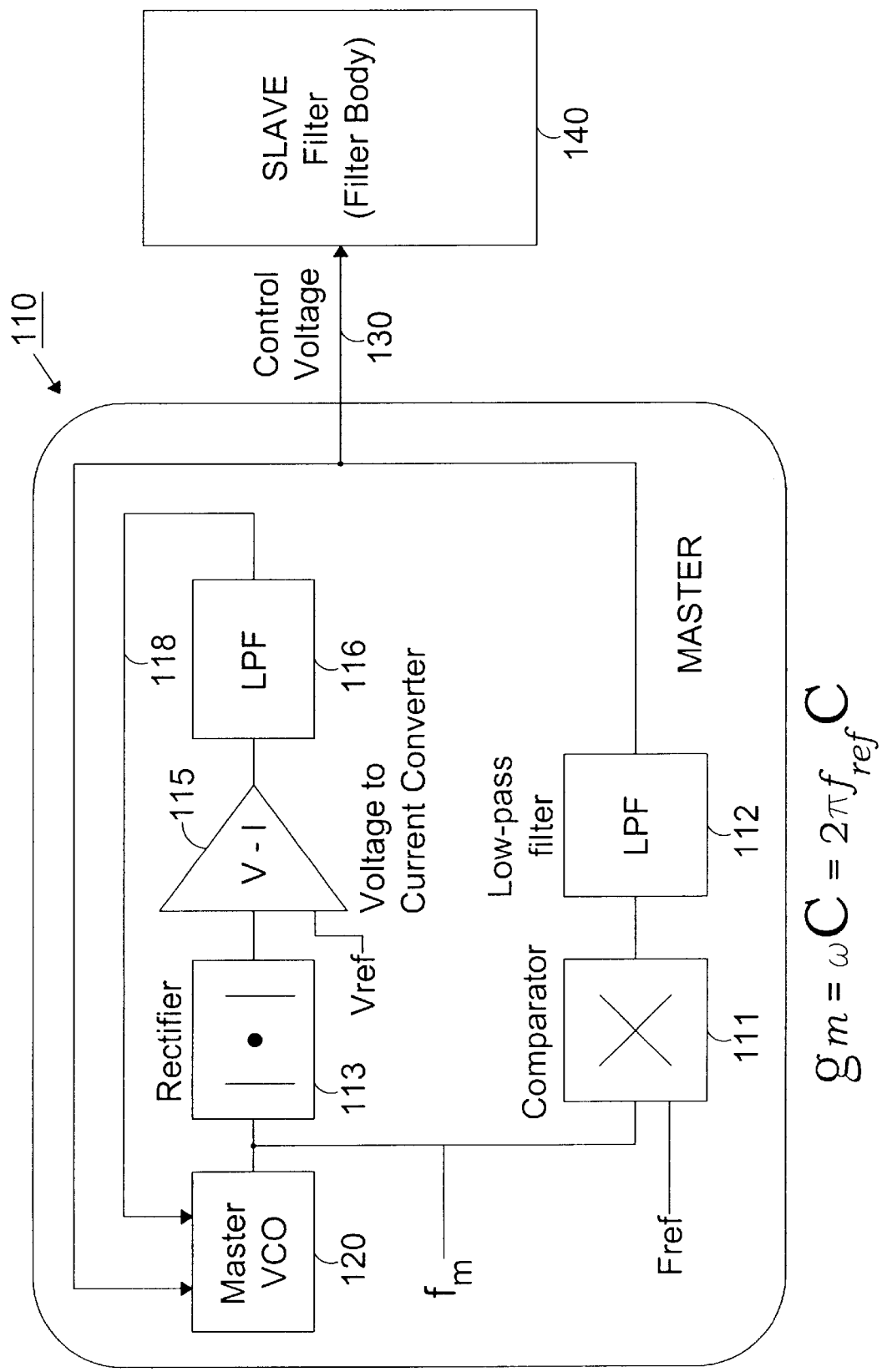
FIG. 1 is a diagram that illustrates a related art master-slave tuning circuit.
Figure 2:
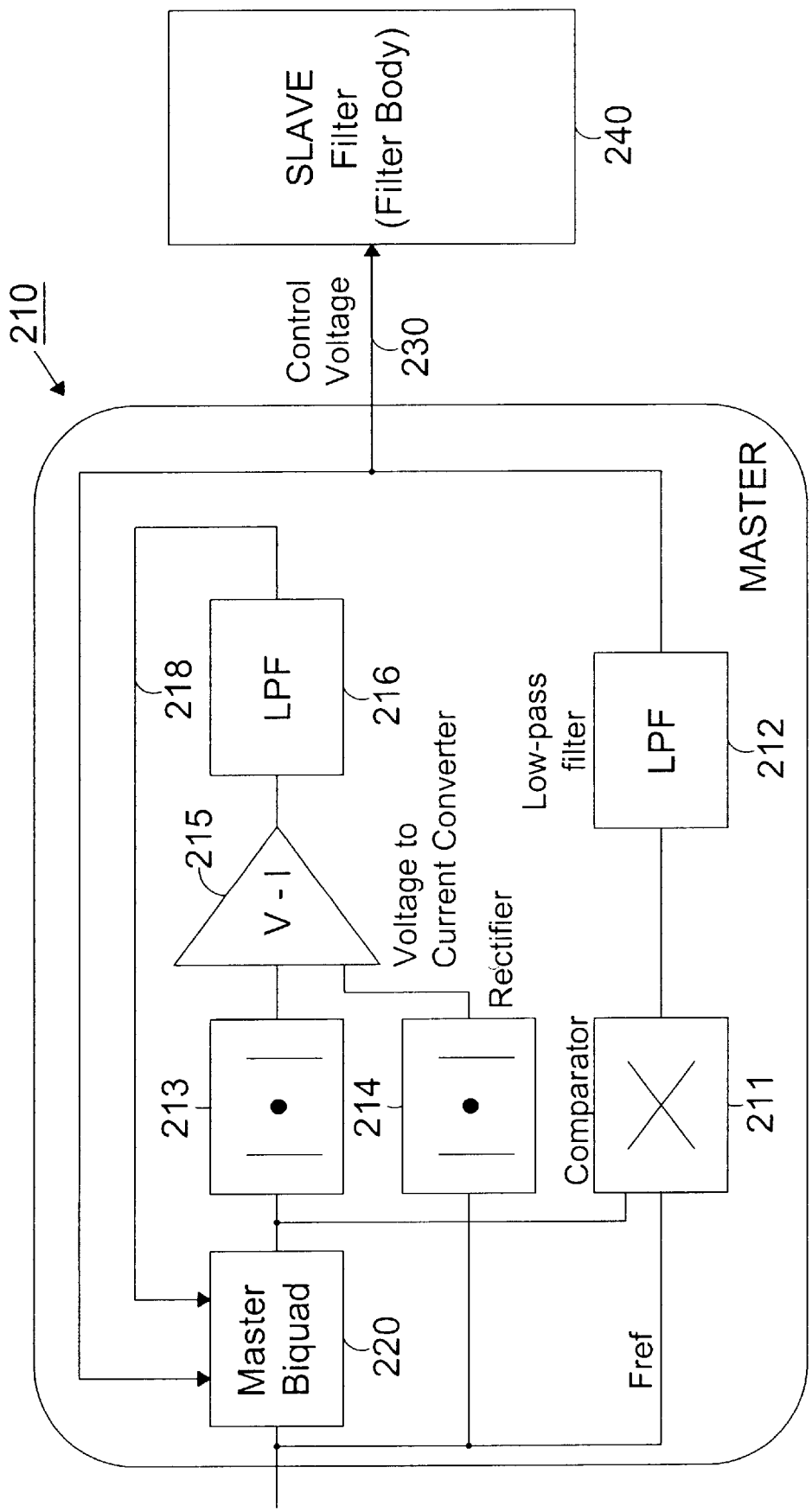
FIG. 2 is a diagram that illustrates another related art master-slave tuning circuit.
Figure 3:
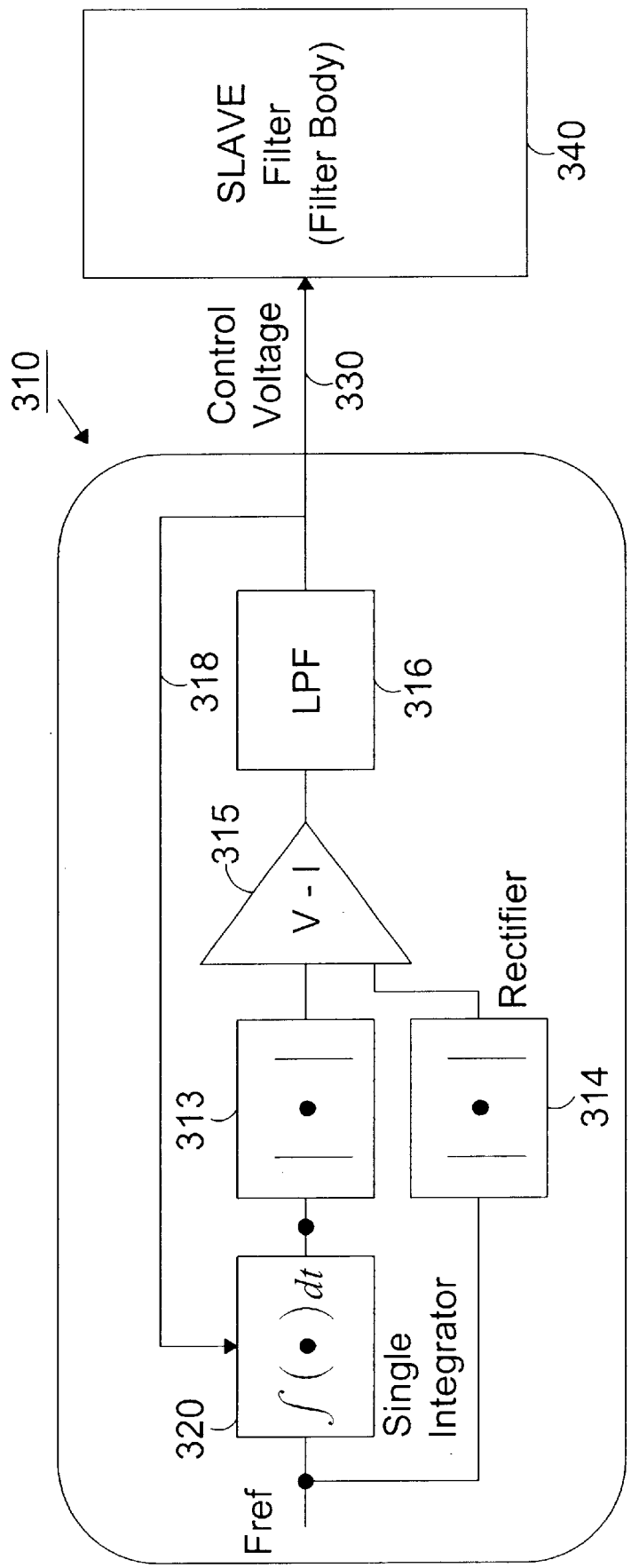
FIG. 3 is a diagram that illustrates yet another related art master-slave tuning circuit.
Figure 4:
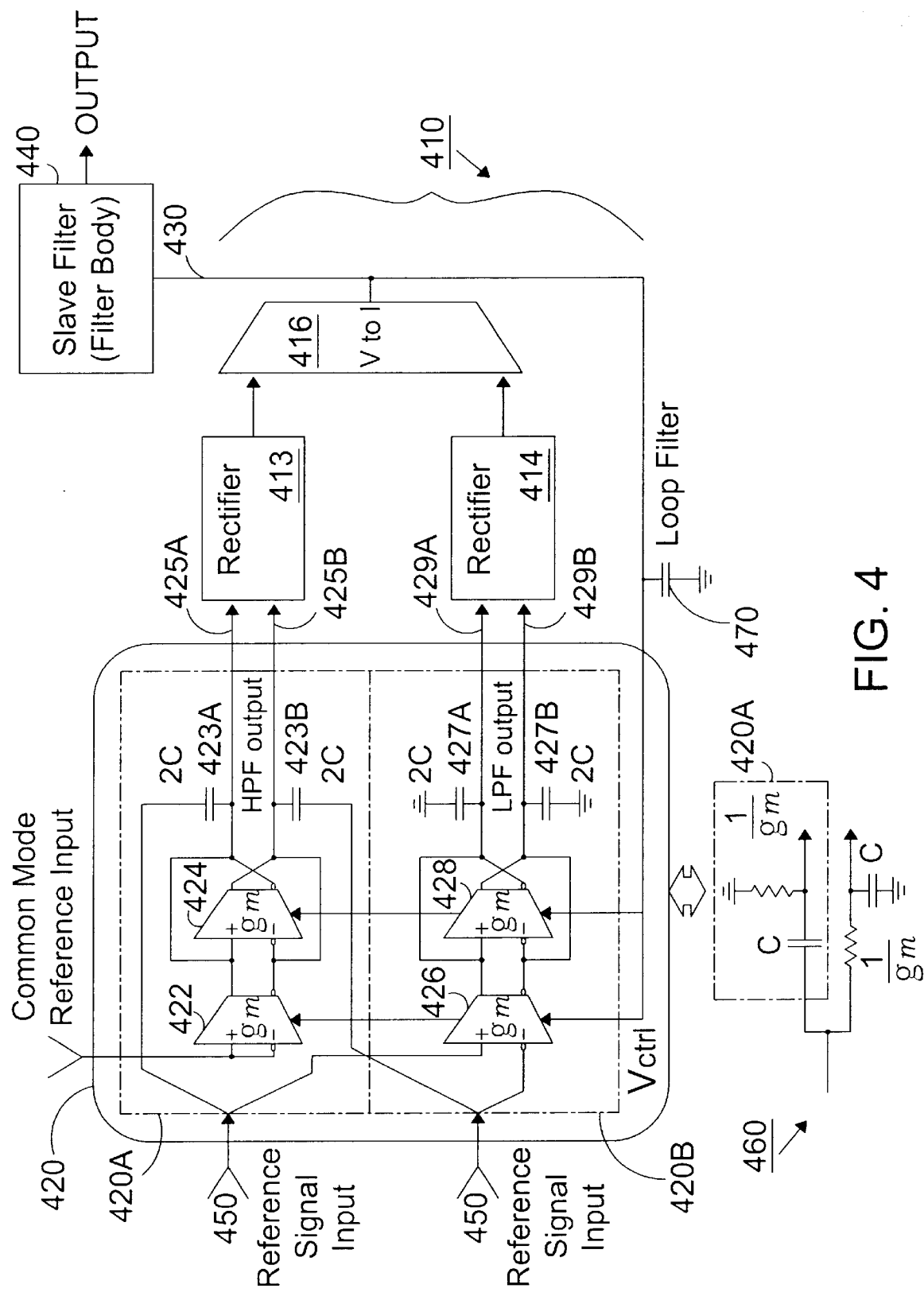
FIG. 4 is a diagram that illustrates a preferred embodiment of a master-slave tuning circuit according to the present invention.

FIG. 4 is a diagram that illustrates a preferred embodiment of a master-slave gm-C tuning circuit in accordance with the present invention. As shown in FIG. 4, a master block 410 copies a control voltage 430 to a slave filter 440. The master block includes a first rectifier 413, a second rectifier 414, a voltage-to-current (V-I) converter 416 and a gm-C poly-phase filter 420. As shown in FIG. 4, the rectifier 413 receives high pass filter output signals 425A, 425B from the filter 420 and the rectifier 414 receives low pass filter output signals 429A, 429B from the filter 420. The V-I converter 416 receives output from the rectifiers 413, 414 and outputs the control voltage 430 to the slave filter 440. The gm-C poly-phase filter 420 includes transconductance amplifiers 422, 424, 426, 428. Positive and negative input ports of transconductance amplifier 422 receive a common mode reference signal. A positive output port of transconductance amplifier 424 is coupled to a negative output port of the transconductance amplifier 422 and a negative input port of the transconductance amplifier 424. A negative output port of the transconductance amplifier 424 is coupled to a positive output port of the transconductance amplifier 422 and a positive input port of the transconductance amplifier 424. In addition, the positive and negative output ports of the transconductance amplifier 424 are output nodes for the high pass filtered (HPF) output signals 425B, 425A, respectively. In addition, positive and negative input ports of the transconductance amplifier 426 are coupled to receive a reference input signal 450. A positive output port of a transconductance amplifier 428 is coupled to the negative output port of the transconductance amplifier 426 and a negative input port of the transconductance amplifier 428. A negative output port of the transconductance amplifier 428 is coupled to a positive output port of the transconductance amplifier 426 and a positive input port of the transconductance amplifier 428. The positive and negative output ports of the transconductance amplifier 428 are output nodes for the low pass filtered (LPF) output signals 429B, 429A, respectively. Thus, the filter 420 includes a high pass filter circuit 420A and a low pass filter circuit 420B. The reference signal 450 is coupled to the positive and negative output ports of the transconductance amplifier 424 through capacitors 423B and 423A, respectively. Capacitors 427A and 427B are coupled between a ground voltage and the negative and positive output terminals of the transconductance amplifier 428. A diagram that illustrates an equivalent circuit 460 of the gm-C poly-phase filter 420 is shown in FIG. 4.

In the preferred embodiment of the master-slave gm-C tuning circuit, the transconductance amplifiers 426, 428 receives the feedback loop control signal Vctrl as a control signal and respectively outputs the control signal Vctrl to the transconductance amplifiers 422 and 424. The sine wave is preferably used a reference signal. As shown in FIG. 4, a 4 MHz sine wave is used as the reference signal to set the filter 420 cut-off frequency.

During operations of the master block 410, as the value of the Vctrl 430 increases, transconductance values (gm) increase and the amplitude of the LPF output signals 429A, 429B increase and the amplitude of the HPF output signals 425A, 425B decrease. The rectifiers 413, 414 preferably detect peak levels of the HPF and LPF output signals respectively, for the comparison. The V-I converter 416 receives the rectified outputs from the rectifiers 413, 414 and generates a pumping current that is preferably proportional to the difference of the amplitude of the rectified output. As a result, the amplitudes of the HPF output signals and LPF output signals are equalized by the negative feedback loop and results in a steady state transconductance value gm shown at equation 3 as follows:

$$\left| \frac{1}{1 + j\omega \frac{C}{g_m}} \right| = \left| \frac{j\omega \frac{C}{g_m}}{1 + j\omega \frac{C}{g_m}} \right| \Leftrightarrow g_m = \omega C = 2\pi f C \quad (3)$$

Figure 7:
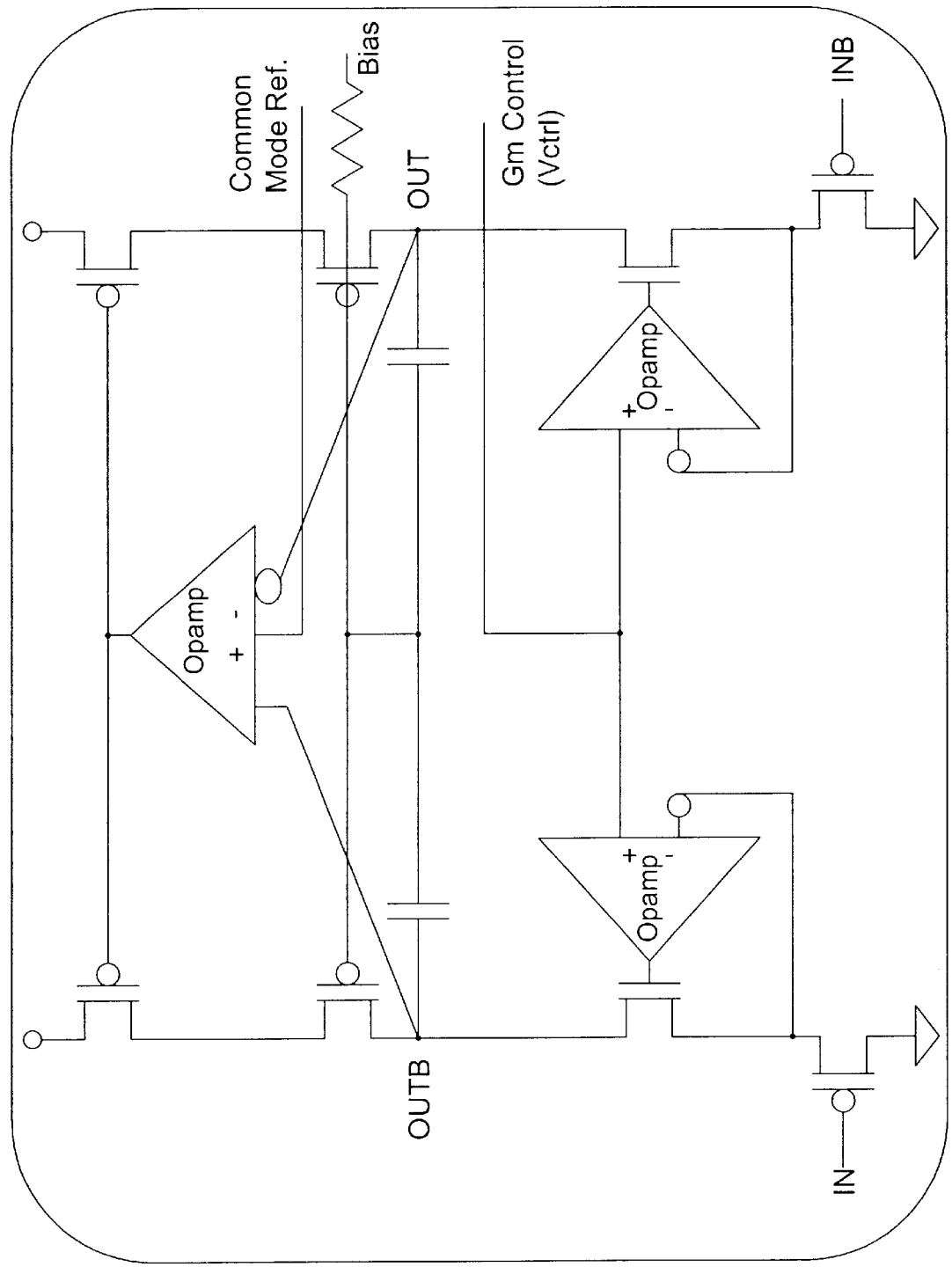
FIG. 7 is a circuit diagram that illustrates an exemplary transconductance amplifier.

As described above, a master block such as the master block 410 according to the preferred embodiments can be adapted as a tuning circuit for various types of transconductance amplifiers. An exemplary transconductance amplifier is illustrated in FIG. 7. The transconductance amplifiers in the high pass filter section and the low pass filter section of the master block 410 preferably provide a similar function of operating as resistor-equivalent whose value is 1/gm ohm. Further, the common mode reference signal is preferably a DC voltage whose value is about half $V_{DD}$ (e.g., ½ the supply voltage). In addition, in the master block 410 a sine wave is the preferred reference signal 450, however, alternative types of signals can be used such as a triangular wave can be applied. The frequency of the reference signal 450 is preferably applied according to the required cut-off frequency of corresponding slave block. For example, if the cut-off frequency of slave filter is 6 MHz, 4 MHz sine wave should be replaced with 6 MHz sine wave.

Figure 5:
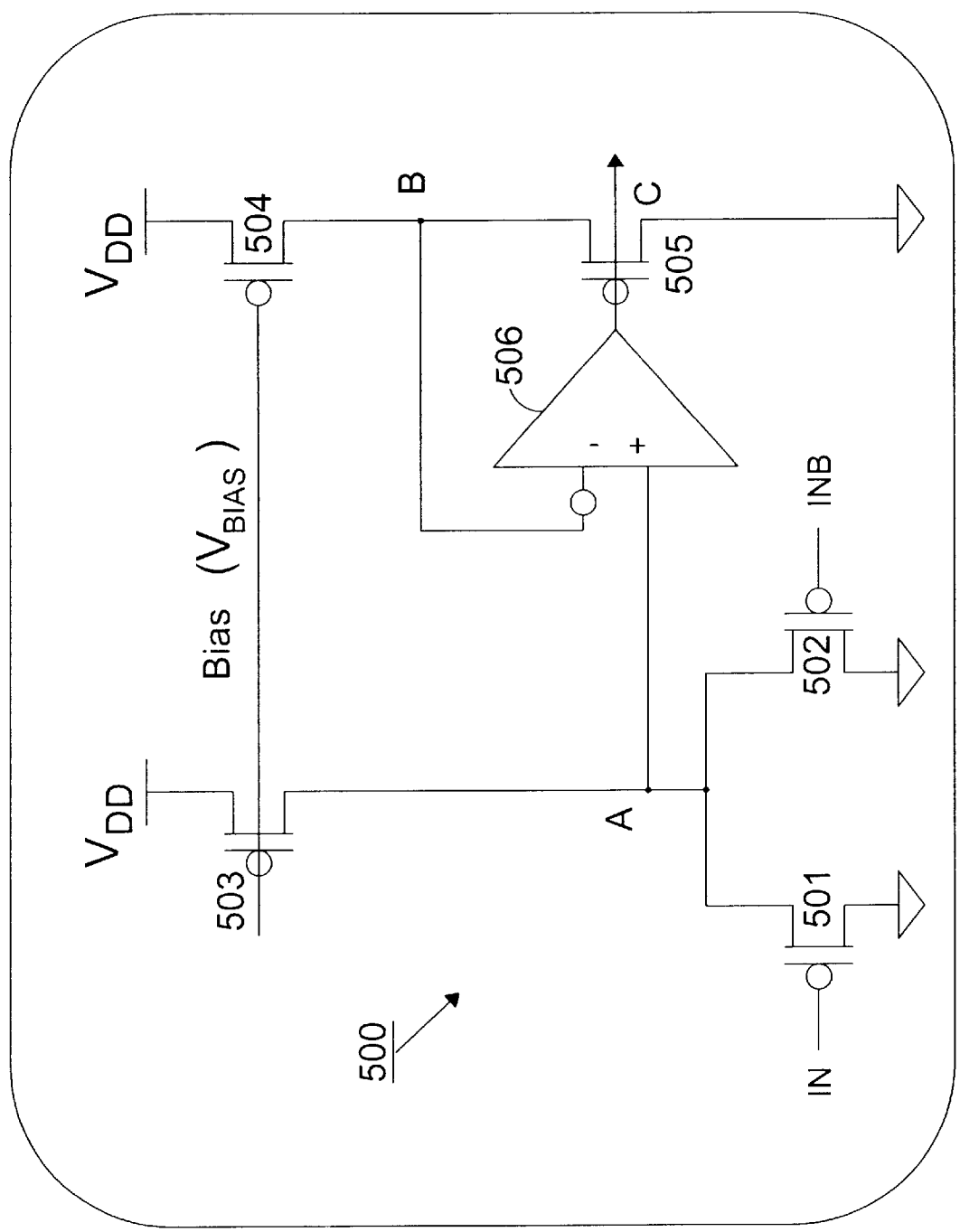
FIG. 5 is a diagram that illustrates a preferred embodiment of a rectifier.

FIG. 5 is a diagram that illustrates a preferred embodiment of a rectifier according to the present invention. As shown in FIG. 5, a rectifier 500 includes PMOS type transistors 501, 502 coupled in parallel between node A and a ground voltage. Gate electrodes of the PMOS transistors 501 and 502 respectively receive an input signal IN and an input signal complement INB. PMOS type transistor 503 is coupled between a source voltage $V_{DD}$ and node A, and PMOS type transistor 504 is coupled between the source voltage $V_{DD}$ and node B. Gate electrodes of the PMOS transistors 503 and 504 receive a bias voltage $V_{Bias}$. A fifth PMOS type transistor 505 is coupled between node B and the ground voltage. An operational amplifier has an inverting terminal coupled to node B, a non-inverting terminal coupled to node A and an output coupled to the gate electrode of the PMOS type transistor 505 to provide an output signal of the rectifier 500. The rectifier 500 can be used as the rectifier 413, 414 in FIG. 4.

Figure 6:
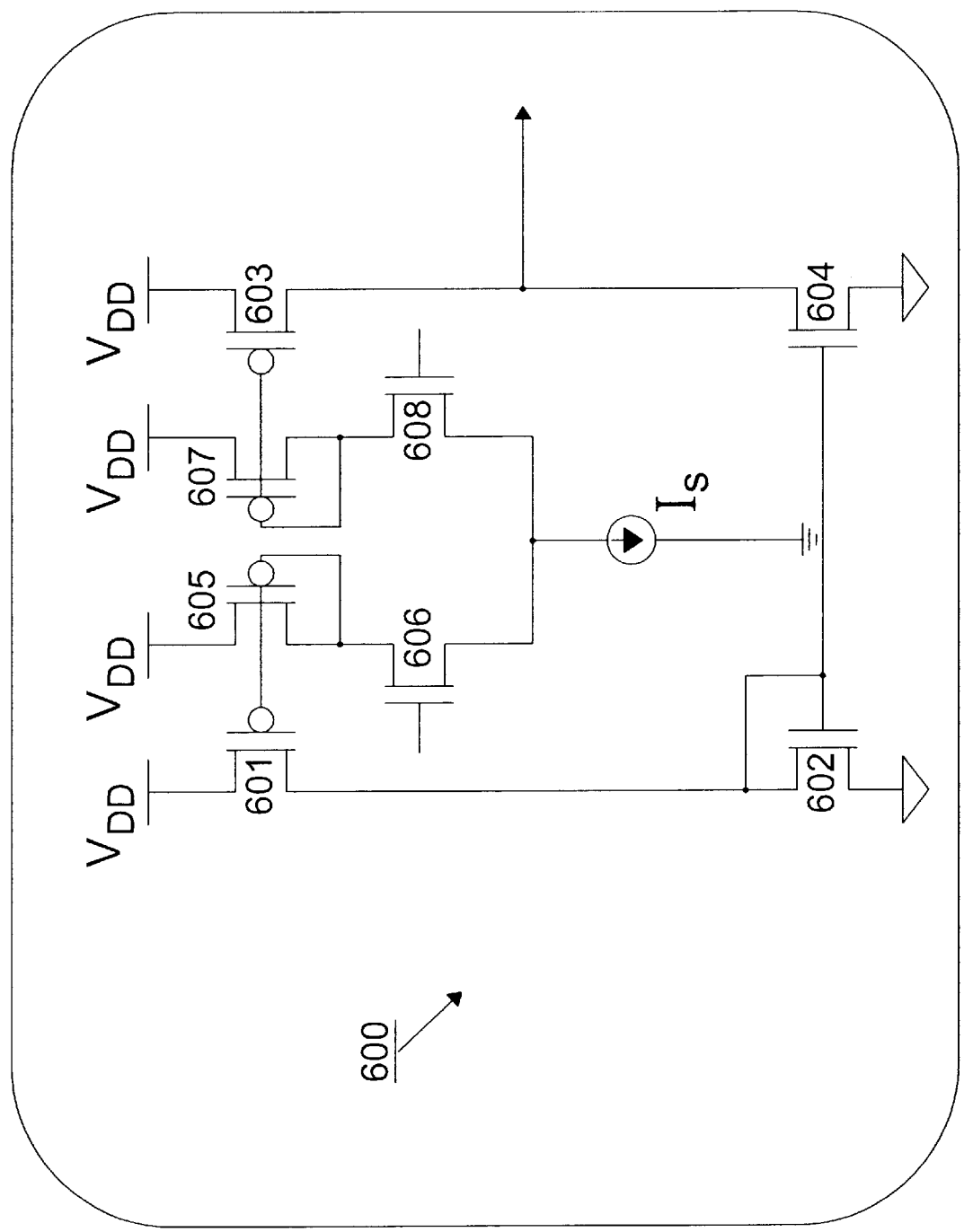
FIG. 6 is a diagram that illustrates a preferred embodiment of a voltage-to-current converter.

FIG. 6 is a diagram that illustrates a preferred embodiment of a V-I converter 600 according to the present invention. As shown in FIG. 6, transistors 601 and 602 are coupled in series between a power source voltage $V_{DD}$ and the ground voltage. Further, transistors 603 and 604 are coupled in series between the source voltage $V_{DD}$ and the ground voltage by commonly coupled drain electrodes that provide an output signal of the V-I converter 600. Transistors 605 and 606 are coupled in series between the source voltage $V_{DD}$ and a current source $I_S$, which is coupled to the ground voltage. Transistors 607 and 608 are coupled in series between the source voltage $V_{DD}$ and the current source $I_S$ by commonly coupled drain electrodes. In addition, gate electrodes and the drain electrode of the transistor 605 are coupled together and to the gate of the transistor 601. Similarly, a gate electrode and the drain electrode of the transistor 607 are coupled together and to the gate electrode of the transistor 603. Gate electrodes of the transistor 606 and 608 respectively receives input signals 620 and 622, respectively. The converter 600 can be used as the V-I converter 416 in FIG. 4.

Figure 8:
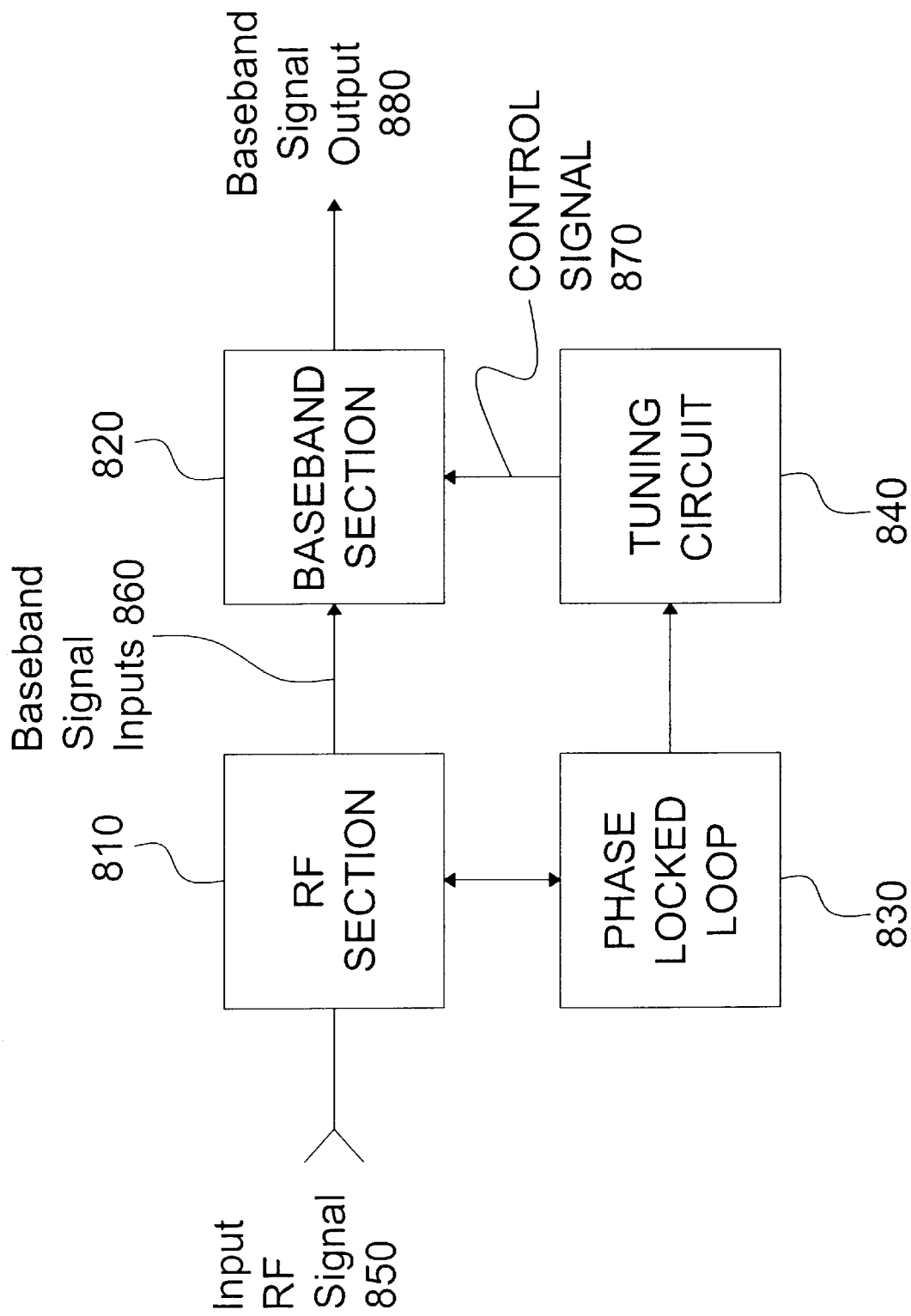
FIG. 8 is a diagram that illustrates a preferred embodiment of an RF communications system.

FIG. 8 is a diagram that illustrates a preferred embodiment of an RF communications system used to generate a baseband signal output 880. The RF communications system includes: an RF section 810 coupled to receive an input RF signal 850; a baseband section 820 coupled to the RF section 810 to receive corresponding baseband signals 860 from the RF section 810; a phase locked loop 830 coupled to the RF section 810; and a tuning circuit 840. The tuning circuit 840 outputs a control signal 870 to the baseband section 820, and includes a master block 410 and a slave block 440 as described above.

As described above, the preferred embodiment of the master-slave tuning circuits and methods of using same according to the present invention have various advantages. The control voltage of a feedback loop (e.g., Vctrl) is copied to a slave circuit and both the master and slave circuits use a gm-C filter. For an accurate amplitude comparison, electrical characteristics including for example common load level, loading capability should be matched. High-pass and low-pass filter portions of a poly-phase filter in the poly-phase filter according to the preferred embodiments use the same filter with different configurations. Further, output signals of the high and low pass filtering come from the same circuits so that both signals have the same electrical characteristics, which result in a more accurate tuning circuit relative to the related art tuning circuits. Further, the preferred embodiment of gm-C poly-phase filter tuning circuit provide a simpler circuit configuration for both the master and slave filter bodies. In addition, the preferred embodiments of a tuning circuit provide an increased robust operations relative to the VCO type related art tuning circuits due to elimination of disadvantages caused by the difficulty of oscillation and to high Q-factor requirements of the VCO type tuning circuits.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A tuning circuit, comprising:
   a slave filter block that receives a first control signal and outputs a second control signal; and
   a master filter block that receives first and second reference signals and outputs the first control signal to the slave filter block, wherein the master filter block comprises,
      a high pass filter and a low pass filter, wherein each of the high and low pass filters receives the first control signal,
      a first rectifier coupled to the high pass filter,
      a second rectifier coupled to the low pass filter, and
      a converter coupled to the first and second rectifiers that outputs the first control signal.

2. The tuning circuit of claim 1, wherein as a value of the first control signal increases, a first amplitude of an output signal of the high pass filter decreases and a second amplitude of an output signal of the low pass filter increases.

3. The tuning circuit of claim 2, wherein the value of the first control signal is adjusted until the first amplitude and the second amplitude are substantially equal.

4. The tuning circuit of claim 1, wherein the high pass filter includes first and second transconductance amplifiers (TA) coupled in series to output a first pair of output signals at first and second output terminals, and wherein the low pass filter includes third and fourth transconductance amplifiers (TA) coupled in series to output a second pair of output signals at third and fourth output terminals.

5. The tuning circuit of claim 4, wherein first and second inputs of the first TA receives the first reference signal, and wherein a first output of the second TA is coupled to the second output terminal, a second output of the first TA and a second input of the second TA, and wherein a second output of the second TA is coupled to a first output terminal, a first output of the first TA and a first input of the second TA.

6. The tuning circuit of claim 5, wherein the first and second inputs of the third TA receives the second reference signal, wherein a first output of the fourth TA is coupled to the fourth output terminal, a second output of the third TA and a second input of the fourth TA, and wherein a second output of the fourth TA is coupled to the third output terminal, a first output of the third TA and a first input of the fourth TA.

7. The tuning circuit of claim 6, wherein a control terminal of the first through fourth TAs receives the first control signal.

8. The tuning circuit of claim 7, further comprising:
   first and second capacitors coupled between the first and second output terminals and the second reference signal; and
   third and fourth capacitors coupled between the third and fourth output terminals and a first prescribed reference voltage, respectively.

9. The tuning circuit of claim 1, wherein the first rectifier comprises:
   first and second transistors coupled between a first node and a first prescribed voltage level;
   a third transistor coupled between a second prescribed voltage level and the first node;
   fourth and fifth transistors coupled in series at a second node between the second prescribed voltage level and the first prescribed voltage level; and
   an operational amplifier having first and second inputs respectively coupled to the first and second nodes and an output coupled to a control electrode of the fifth transistor, wherein a control electrode of the third and fourth transistors receives a third prescribed voltage, and wherein control electrodes of the first and second transistors receives first and second input signals, respectively.

10. The tuning circuit of claim 1, wherein the converter is a voltage-to-current converter comprising:
    first and second transistors coupled in series between a second prescribed voltage and a first prescribed voltage;
    third and fourth transistors coupled in series at an output terminal of the converter between the second prescribed voltage and the first prescribed voltage;
    fifth and sixth transistors coupled in series between the second prescribed voltage and a first node;
    seventh and eighth transistors coupled in series between the second prescribed voltage and the first node; and
    a current source coupled between the first node and the first prescribed voltage.

11. The tuning circuit of claim 1, wherein the first reference signal is a DC voltage and the second reference signal is a sine wave.

12. The tuning circuit of claim 11, wherein the sine wave is a 4 MHz sine wave.

13. The tuning circuit of claim 4, wherein the rectifiers operate to allow comparison of the first and second pairs of output signals in the converter.

14. A receiver for an RF communications system, comprising:
    an RF section coupled to receive an input RF signal;
    a baseband section coupled to the RF section to receive corresponding baseband input signals from the RF section and to output baseband output signals;
    a phase locked loop coupled to the RF section; and
    a tuning circuit that outputs a first control signal to the baseband section, wherein the tuning circuit includes,
       a master block comprising,
          a first high pass filter and a first low pass filter, wherein each of the first high and low pass filters receive a second control signal,
          a first rectifier coupled to the first high pass filter,
          a second rectifier coupled to the first low pass filter, and
          a first converter coupled to the first and second rectifiers that outputs the second control signal to the first high and low pass filters, and
       a slave block comprising,
          a second high pass filter and a second low pass filter, wherein each of the second high and low pass filters receive the second control signal,
          a third rectifier coupled to the second high pass filter,
          a fourth rectifier coupled to the second low pass filter, and
          a second converter coupled to the third and fourth rectifiers that outputs the first control signal to the baseband section.

15. A tuning circuit, comprising:

slave filtering means for receiving a first control signal and outputting a second control signal; and master filtering means for receiving a first and a second prescribed reference signal and outputting the first control signal to the slave filtering means, wherein the master filtering means comprises:

high pass filtering means and a low pass filtering means for filtering the first and second prescribed reference signals, wherein each of the high and low pass filtering means receives the first control signal, first rectifying means coupled to the high pass filtering means, second rectifying means coupled to the low pass filtering means, and converting means coupled to the first and second rectifying means for outputting the first control signal.

16. The tuning circuit of claim 15, wherein as a value of the first control signal decreases, a first amplitude of an output signal of the high pass filtering means increases and a second amplitude of an output signal of the low pass filtering means decreases.

17. The tuning circuit of claim 16, wherein the value of the first control signal is adjusted until the first amplitude and the second amplitude are substantially equal.

18. The tuning circuit of claim 15, wherein the high pass filtering means includes first and second transconductance amplifiers (TA) coupled in series to output a first pair of output signals at first and second output terminals, and wherein the low pass filtering means includes third and fourth transconductance amplifiers (TA) coupled in series to output a second pair of output signals at third and fourth output terminals.

19. The tuning circuit of claim 18, wherein the first rectifying means comprises:

first and second transistors coupled between a first node and a first prescribed voltage level;

a third transistor coupled between a second prescribed voltage level and the first node;

fourth and fifth transistors coupled in series at a second node between the second prescribed voltage level and the first prescribed voltage level; and an operational amplifier having first and second inputs respectively coupled to the first and second nodes and an output coupled to a control electrode of the fifth transistor, wherein a control electrode of the third and fourth transistors receives a third prescribed voltage, and wherein control electrodes of the first and second transistors receive first and second input signals, respectively.

20. The tuning circuit of claim 18, wherein the converter means is a voltage-to-current converter comprising:

first and second transistors coupled in series between a second prescribed voltage and a first prescribed voltage;

third and fourth transistors coupled in series at an output terminal of the converter means between the second prescribed voltage and the first prescribed voltage;

fifth and sixth transistors coupled in series between the second prescribed voltage and a first node;

seventh and eighth transistors coupled in series between the second prescribed voltage and the first node; and a current source coupled between the first node and the first prescribed voltage.

* * * * *